United States Patent
Fu et al.

(10) Patent No.: US 9,050,775 B2
(45) Date of Patent: Jun. 9, 2015

(54) METHODS OF FABRICATING TRANSPARENT AND NANOMATERIAL-BASED CONDUCTIVE FILM

(71) Applicant: Nano and Advanced Materials Institute Limited, HK (HK)

(72) Inventors: Li Fu, Hong Kong (HK); Caiming Sun, Hong Kong (HK); Man-Ho So, Hong Kong (HK); Kai Li, Hong Kong (HK); Chau-Shek Li, Hong Kong (HK); Tak-Hei Lam, Hong Kong (HK)

(73) Assignee: NANO AND ADVANCED MATERIALS INSTITUTE LIMITED (HK)

( * ) Notice: Subject to any disclaimer, the term of this patent is extended or adjusted under 35 U.S.C. 154(b) by 217 days.

(21) Appl. No.: 13/650,187

(22) Filed: Oct. 12, 2012

(65) Prior Publication Data
US 2014/0106134 A1    Apr. 17, 2014

(51) Int. Cl.
| | | |
|---|---|---|
| G03F 7/20 | (2006.01) | |
| B32B 3/10 | (2006.01) | |
| C09D 11/00 | (2014.01) | |
| G03F 7/004 | (2006.01) | |
| B82Y 30/00 | (2011.01) | |

(52) U.S. Cl.
CPC ........... *B32B 3/10* (2013.01); *Y10T 428/24802* (2015.01); *G03F 7/20* (2013.01); *B82Y 30/00* (2013.01); *C09D 11/00* (2013.01); *G03F 7/0047* (2013.01)

(58) Field of Classification Search
CPC .. Y10T 428/24802; B32B 3/10; B82Y 30/00; G03F 7/0047; G03F 7/20; C09D 11/00
USPC ................................... 430/311; 977/762, 901
See application file for complete search history.

(56) References Cited

U.S. PATENT DOCUMENTS

| | | | |
|---|---|---|---|
| 6,407,486 B1* | 6/2002 | Kimura et al. | 310/364 |
| 7,820,097 B2* | 10/2010 | Schroder et al. | 419/45 |
| 8,049,333 B2 | 11/2011 | Alden et al. | |
| 8,174,667 B2 | 5/2012 | Allemand et al. | |
| 2002/0094384 A1* | 7/2002 | Leonard | 427/359 |
| 2008/0283799 A1 | 11/2008 | Alden et al. | |
| 2008/0286447 A1 | 11/2008 | Alden et al. | |

(Continued)

FOREIGN PATENT DOCUMENTS

| | | |
|---|---|---|
| WO | 2010143701 A1 | 12/2010 |
| WO | 2011097470 A2 | 8/2011 |

OTHER PUBLICATIONS

Gaynor et al., "Smooth nanowire/polymer composite transparent electrodes.", Adv Mater., 2011, 23(26), 2905-10.

(Continued)

*Primary Examiner* — Brittany Raymond
(74) *Attorney, Agent, or Firm* — Ella Cheong Hong Kong; Sam T. Yip

(57) ABSTRACT

The present invention relates to methods of fabricating transparent conductive films based on nanomaterials, in particular, silver nanowires. The present invention incorporates a single step of annealing and patterning the conductive films by using a high energy flash lamp without post treatment to improve the conductivity and create substantially invisible patterns on the films for use in touch panel or display manufacturing industry.

18 Claims, 6 Drawing Sheets

(56) References Cited

U.S. PATENT DOCUMENTS

| | | |
|---|---|---|
| 2010/0264378 A1 | 10/2010 | Naoi et al. |
| 2010/0266956 A1 | 10/2010 | Naoi et al. |
| 2011/0192633 A1* | 8/2011 | Allemand .................. 174/128.1 |
| 2012/0061130 A1 | 3/2012 | Yoshi et al. |
| 2013/0008690 A1* | 1/2013 | Wiley et al. ............... 174/120 C |

OTHER PUBLICATIONS

Madaria et al., "Uniform, Highly Conductive, and Patterned Transparent Films of a Percolating Silver Nanowire Network on Rigid and Flexible Substrates Using a Dry Transfer Technique", Nano Res, 2010, 3: 564-573.

European Search Report of EP12188352.4 dated of Jul. 3, 2013.

* cited by examiner

METHODS OF FABRICATING TRANSPARENT AND NANOMATERIAL-BASED CONDUCTIVE FILM

CROSS-REFERENCE TO RELATED APPLICATIONS

There are no related prior applications.

FIELD OF THE INVENTION

The present invention relates to methods of fabricating transparent conductive films based on nanomaterials, in particular, silver nanowires. The present invention incorporates a single step of annealing and patterning the conductive films by using a high energy flash lamp without post treatment to improve the conductivity and create substantially invisible patterns on the films for use in touch panel or display manufacturing industry.

TECHNICAL BACKGROUND

Conventional method of making silver nanowires is by solution process, and the nanowires are coated on the substrate by various coating methods (US Pub. No. 2011/0192633). The silver nanowire-based film made by the conventional method needs to go through post treatment or post annealing process in order to obtain an improved conductivity. Typical post treatment is by heating the film to an elevated temperature, e.g. between 100-150° C., such that the non-conductive material on the surface of the silver nanowires can be removed and the nanowires per se have a closer contact with each other. The first problem of using such a high temperature for the post treatment is the possibility of damaging the substrate of the films and the conductive area. Post treatment using high temperature also requires relatively longer time and higher cost. The method also requires subsequent material removal step by etching. High temperature also does not favor any patterning of the films. A refractive index-matching material used is normally needed, for example, when tin-doped indium oxide (ITO) is used as a substrate for the transparent conductive film, and after etching the film, a material having a refractive index matching the ITO is required in order to make the pattern invisible. Photosensitive materials in the ink for coating are degraded thermally under high temperature which damages the silver nanowire network, hence reduces the conductivity of the damaged area. When the damaged area is subject to UV light treatment, those photosensitive materials are further degraded in order to become less conductive. Silver nanowires, on the other hand, are not degraded under UV exposure and therefore become more conductive. Patterning using the conventional method by defining more conductive and less conductive areas results in a low optical property difference, hence it does not create invisible pattern in transparent conductive film.

In view of the foregoing problems, a new fabrication method for transparent conductive film with fewer process steps and favoring patterning of the film is demanded, especially in the manufacturing of touch panel and other displays with patterns.

SUMMARY OF THE INVENTION

A first aspect of the present invention relates to a method of fabricating conductive film based on nanomaterials, characterized in that a one-step annealing and patterning process is employed by using a high energy flash lamp. The method of the present invention includes: cleaning a substrate with at least three different solvents; drying the substrate at a first temperature for a first period of time; immersing the substrate in a boiling isopropyl alcohol (IPA) for a second period of time; and further drying the substrate at high temperature for a third period of time; and coating a nanomaterials-containing ink on a substrate to form a coated substrate, where the nanomaterials are dissolved into an organic solvent. After examining the coated substrate using microscopy, the coated substrate is masked by a physical mask when it is under the exposure of the high energy flash lamp. The nanomaterials used in the method are silver nanowires. The high energy flash lamp used can generate a high pulse of light with a wavelength from 240 nm to 1,000 nm. The peak power density during each pulse can be up to about 1,000 times of its average power density. No temperature curing is required for the conductive film prepared by the method of the present invention, but rather using the high energy flash lamp to perform photonic curing during the one-step annealing and patterning process on the coated substrate. The physical mask with pattern(s) is used to place between the coated substrate and the high energy flash lamp to create patterns on the conductive film during the one-step annealing and patterning process. A corresponding pattern(s) is/are formed on the coated substrate under the exposure of the high energy flash lamp in the presence of the physical mask. Those areas exposed to the lamp become conductive while other areas being masked by the physical mask become non-conductive. A substantially invisible pattern can be formed by the one-step annealing and patterning process of the present invention which avoids any thermal damage or chemical damage on the conductive film by etching in those conventional methods known in the art.

A second aspect of the present invention relates to a conductive film made by the method of the present invention. The conductive film of the present invention mainly includes a substrate and a coating containing a plurality of nanomaterials. The nanomaterials of the present invention are silver nanowires. The nanowires of the present invention may be linear, particle-like, spherical, or cylindrical in shape. An exemplary embodiment is linear and the length is about 10-15 µm with a diameter of about 70 nm, or in an aspect ratio over 150. More preferably, the aspect ratio is over 200.

DETAILED DESCRIPTION OF THE INVENTION (A) Cleaning of Substrate Before Coating A preferred substrate for being coated with nanomaterials is polyethylene terephthalate (PET) sheet. Before being coated with nanomaterials, the PET sheet is subject to a cleaning process as described herein: (i) Wiping the PET sheet with a detergent; (ii) rinsing the PET sheet with deionized water; (iii) rinsing the PET sheet with acetone; (iv) drying the PET sheet in oven at 70° C. for about 5 minutes; (v) immersing the PET sheet in a boiling isopropyl alcohol for about 10 minutes; (vi) rinsing the PET sheet with a fresh isopropyl alcohol; and (vii) drying the PET sheet in oven at 70° C. for about 15 minutes. The substrate of the present invention can also be cleaned according to the method described in *Adv. Mater.* 2011, 23, 2905-2910, the disclosure of which is incorporated herein by reference.

Figure 1:
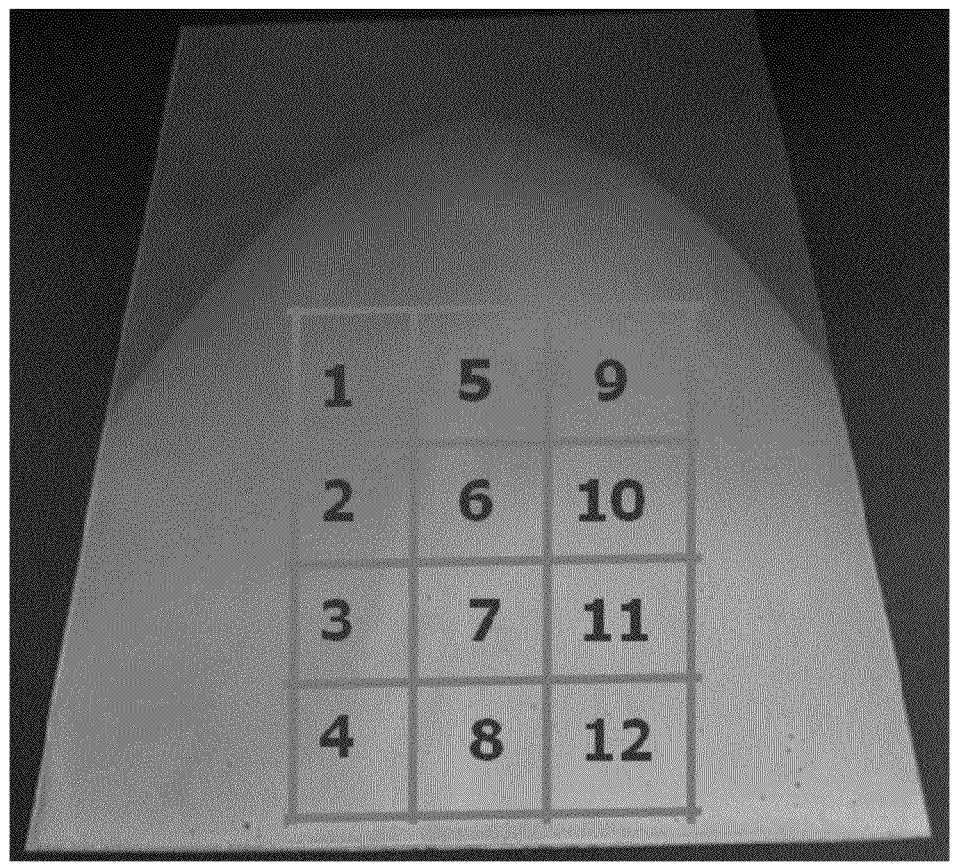
FIG. 1: A photo image taken under a light contrast microscope depicts a coated substrate which is cut into twelve pieces according to the square grid for further exposure to high energy flash light

(B) Preparation of Coated Substrate 10 g/L silver nanowires are first dissolved in 90% v/v isopropyl alcohol/ethanol solvent to prepare a silver nanowires-containing ink. The silver nanowires-containing ink is then coated on the PET sheet by using an adhesive coating device. In one embodiment, the adhesive coating device is Mayer rod coater. Rod size of the Mayer rod can vary depending on the coating amount required. Each rod size has an assigned rod number, e.g. rod numbers 4-20. Rod numbers 4-20 can be used in the present invention. More specifically, rod numbers 4-10 is used. In an exemplary embodiment, the Mayer rod number 4 is used for coating the silver nanowires-containing ink on the substrate. In a preferred embodiment, the ink is coated on the substrate by using the Mayer rod number 4 at 34° C. The ink is added alongside with the movement of the Mayer rod. In one embodiment, the movement of the Mayer rod is kept at 120 cm per minute. The rate of adding the ink on the substrate is controlled and maintained at a constant speed of about 2-5 ml/min with an aid of a syringe pump. The actual rate is subject to the size of the substrate. Other conventional coating method can be used such as spray coating or gravure printing if it can produce the same quality and quantity of the coated substrate of the present invention. After coating the silver nanowires-containing ink on the substrate, the coated substrate is then subject to drying in oven at 70° C. for about 5 minutes. The coated substrate after drying is then examined under a light microscope. Square grid is used to cut the coated substrate into smaller pieces for further treatment (as shown in FIG. 1). The further treatment includes but not limited to photonic curing, annealing and/or photo-masking. In an exemplary embodiment, the photonic curing, annealing and photo-masking can be performed in a single step by subjecting the coated substrate, after being cut into smaller pieces, to a xenon-based sintering system.

(C) One-Step Annealing and Patterning on Conductive Film:

A high energy, air-cooling flash lamp is used in the present invention to provide a high energy pulse. In an exemplary embodiment, a high energy xenon lamp is used to provide a broad spectrum of light from 240 nm to 1,000 nm. A more preferred embodiment uses a narrower range of light spectrum from 370 nm to 1,000 nm. The average power density exposed to the coated substrate is about 10 W/cm$^2$. The pulse rate of the flash light generated by the flash lamp is about 2 pulses per second, or more specifically, the pulse duration is about 0.52 ms. The peak power density during each pulse is about 1,000 times higher than the average power density. Optionally, a continuous light source which is capable of generating the same high level of power density can be used as the high energy flash lamp of the present invention.

Figure 2:
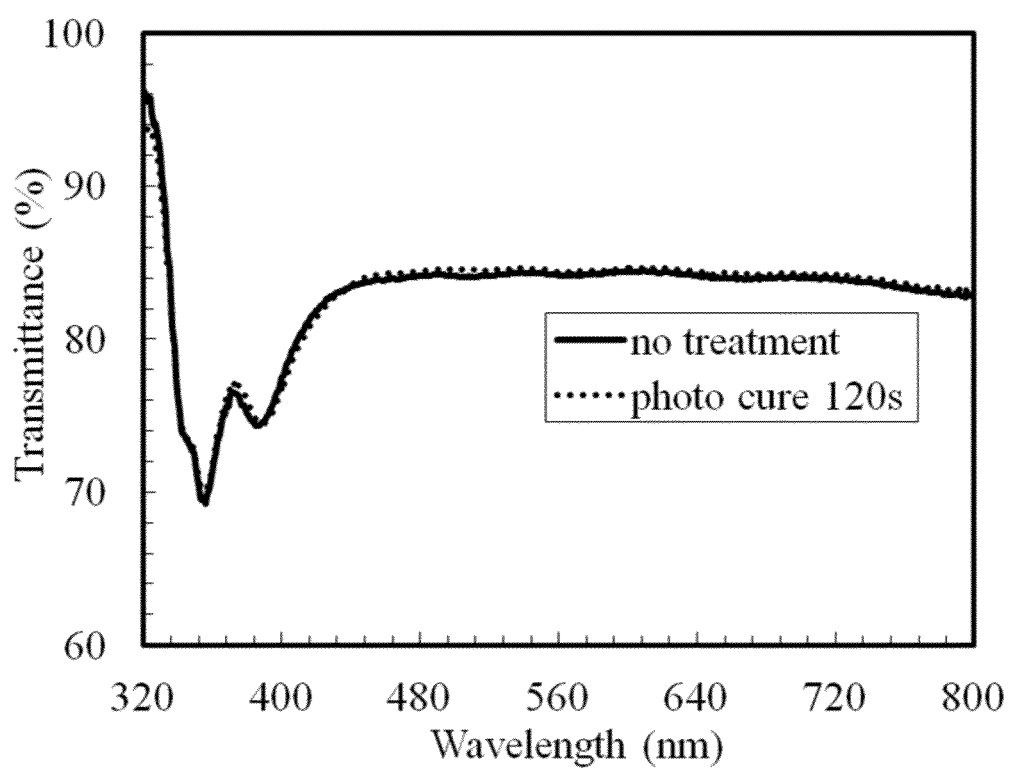
FIG. 2: Transmittance (%) of the conductive film before and after photocuring under the high level flash light

After exposure to the high energy flash lamp, transmittance of the conductive film is measured as compared to that without exposure to the flash lamp. FIG. 2 shows that the conductive film having been exposed to the flash lamp for about 1-120 seconds has the same pattern of percentage change in transmittance as compared to that without exposure to the flash lamp (the transmittance is measured under a light transmission at a wavelength of 320 nm to 800 nm). It reveals that the exposure to the flash lamp does not affect the transmittance of the conductive film.

Figure 3:
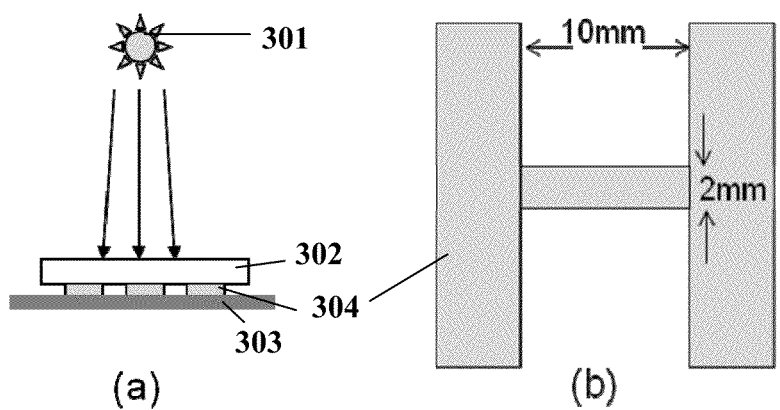
FIG. 3: Schematic diagrams depict how a one-step annealing and patterning process is achieved on the conductive film using the high energy flash light: 3a (left panel) shows an example of positioning a physical mask 302 between the high energy flash light 301 and the conductive film 303; 3b (right panel) shows the dimension of a pattern 304 being made on the conductive film by the one-step annealing and patterning process

FIGS. 3*a* and 3*b* are schematic diagrams of how annealing and patterning are carried out at the same time using the high energy flash lamp. In FIG. 3*a*, a physical mask 302 is situated along the light transmission between the flash lamp 301 and the conductive film 303. The physical mask can vary in shape, pattern, dimension and thickness. The materials of the physical mask include but not limited to glass or metal. FIG. 3*b* is an example of a pattern 304 on the film corresponding to the corresponding pattern of the physical mask. In this example, a physical mask with two large pads connected by one narrower strip with a length of 10 mm and a width of 2 mm is used to mask the film in order to generate the pattern 304 with substantially the same size and shape on the conductive film under the exposure of the flash lamp. The average power density used in this example is 10 W/cm$^2$. The sheet resistance (Rs) of the conductive film under the exposure of the flash lamp is about 15Ω/□. As shown in FIG. 2, the percentage transmittance of the conductive film after exposure to flash light is larger than 80% (which is measured under 400-800 nm of light transmission and with the subtract of PET substrate background).

Figure 4:
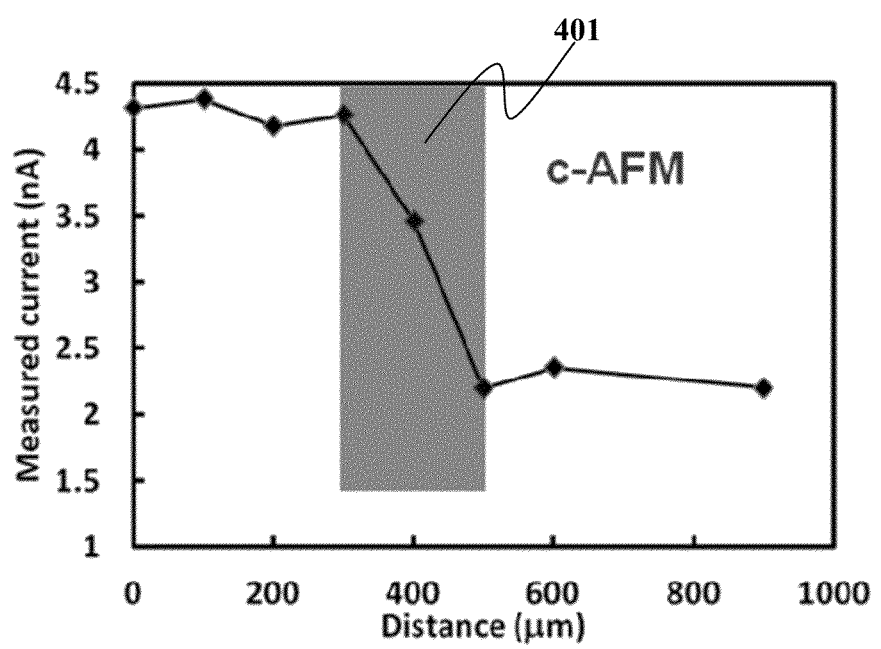
FIG. 4: Conductivity variations across the mask boundary measured by conductive atomic force microscopy (c-AFM)

(D) Determination of Conductivity Variations by Conductive Atomic Force Microscopy:

In order to verify the conductivity variations of the conductive film, conductive atomic force microscopy (c-AFM) is utilized and the conductivity variations in terms of a current passing through a c-AFM tip which is moving from the unmasked area across the mask boundary to the masked area of the conductive film are illustrated in FIG. 4. The shaded area in FIG. 4 represents a transition zone 401 at the mask boundary where the conductivity of the film is changed significantly. A bias of 2V is applied on the c-AFM tip to pass the current from the tip to the conductive film. The result demonstrates that the measured current drops significantly when the c-AFM tip is crossing the transition zone 401 of the mask boundary (i.e., the shaded area in FIG. 4). While the current passing through the c-AFM tip is measured, a series of scanning c-AFM images are being taken across the mask boundary. A 2 μm×2 μm scanning image is taken at every 100 μm distance along the path of which c-AFM tip is moving. From the number of images taken, it is estimated that the distance of the transition zone 401 is about 200 μm. The term "transition zone" used herein is defined as the area at the boundary of the mask when it is placed above the conductive film such that a corresponding area on the conductive film is formed under the exposure of the flash lamp where the conductive film is changed from conductive zone into non-conductive zone.

Figure 5:
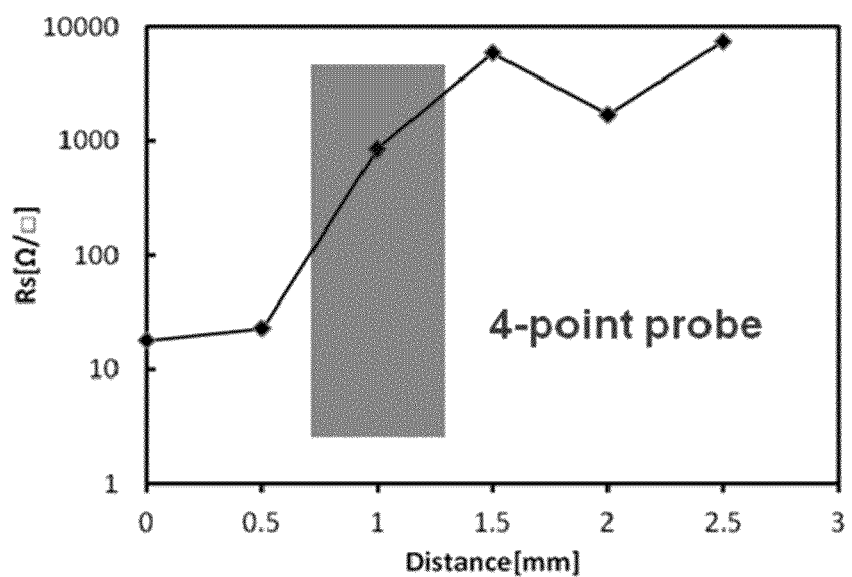
FIG. 5: Sheet resistance (Rs) between exposed and non-exposed areas on the conductive film by four-point probe

(E) Quantitative Characterization of Conductivity by Four-Point Probe Method:

In order to provide a quantitative characterization of the conductivity at the patterned domain on the conductive film after exposure to the flash light, scanning readings of the sheet resistance (Rs) are recorded at every 0.5 mm distance using a four-point probe method. FIG. 5 demonstrates a significant difference in Rs readings between the exposed (or unmasked) and unexposed (or masked) area. The shaded area in FIG. 5 represents the mask boundary, or called transition zone 401 as in FIG. 4. When the four-point probe is moving along the mask boundary from the exposed (or unmasked) area to the unexposed (or masked area), the Rs readings are significantly increased (by almost 1,000 times between the lowest and highest readings). Such a significant increase in Rs readings reveals that the conductivity of the film is significantly enhanced through the photo-curing of the exposed (unmasked) area under the exposure to the flash lamp.

Figure 6:
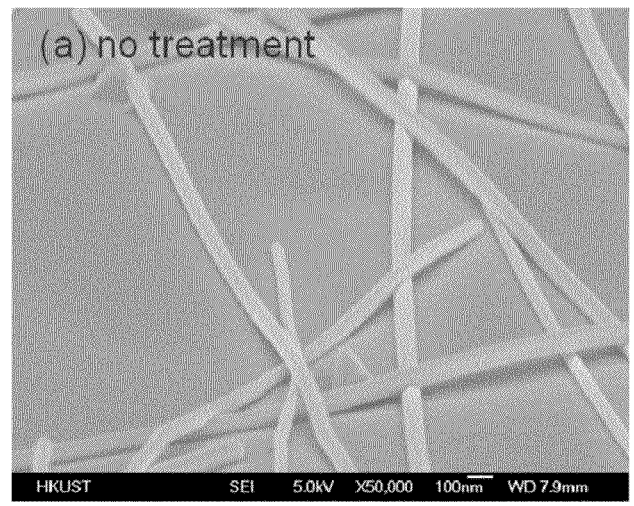
FIG. 6: Tilted SEM images of silver nanowires without photocuring (upper panel) versus with photocuring under the exposure of high energy flash light (lower panel).
Figure 6:
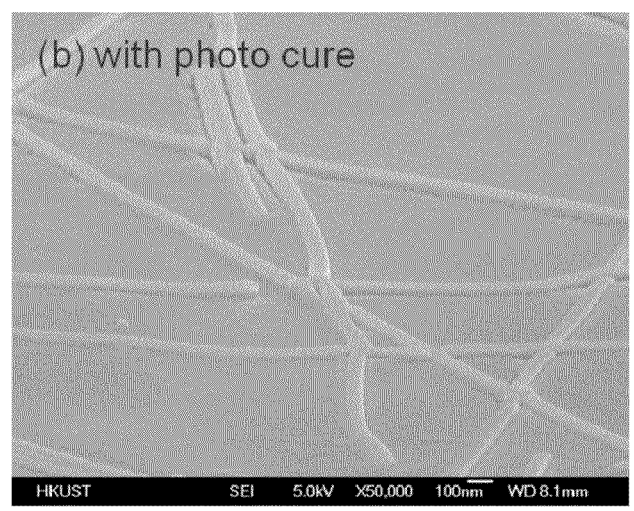

(F) Morphological Characterization of Conductive Film:

Morphology of the conductive film is observed under scanning electron microscopy (SEM). FIG. 6a shows that the silver nanowires coated on the substrate but without a subsequent exposure to the flash lamp are loosely stacked on each other. These nanowires are surrounded by insulating polyvinylpyrrolidone (PVP) residues and a high junction resistance is generated at the contact points between the nanowires. On the other hand, the silver nanowires coated on the substrate followed by exposure to the high energy flash lamp of the present invention result in a more intact nanowire network as shown in FIG. 6b. The nanowires under the exposure to the high energy flash lamp are fused together to form a network-like structure. Internal heat between the nanowires generated under the exposure to the flash lamp greatly reduces the junction resistance such that the exposed (or unmasked) area becomes more conductive than the films using the convention methods. The insulting PVP residues in the film are simultaneously photo-cured by the high energy flash lamp of the present invention. Thus, no additional step of thermal curing or etching is required in the present invention.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes exemplary embodiments of the invention, these descriptions should not be viewed in a limiting sense. Rather, there are several variations and modifications which may be made without departing from the scope of the present invention as defined in the appended claims.

INDUSTRIAL APPLICABILITY

The methods disclosed in the present invention are useful in manufacturing thin films for touch panel and other displays because the reduced number of steps by using a high energy flash lamp as a source to generate high energy pulse can save cost and time. The avoidance of thermal curing or chemical curing by etching in post treatment also preserves the nanowire structure and enhances the conductivity of the thin film. The pattern generated by the methods of the present invention is also substantially invisible without using a material having a pre-determined refractive index matching the substrate of the thin film.

What we claim:

1. A method of fabricating a transparent and nanomaterial-based conductive film comprising:
   (a) cleaning a substrate as a support for the conductive film;
   (b) providing a non-photosensitive nanomaterial-containing ink;
   (c) coating said nanomaterial-containing ink on said substrate to form a coated substrate;
   (d) masking said coated substrate by a physical mask at one or more desired areas such that said desired areas being masked by said physical mask will become electrically non-conductive due to internal heat generated between the nanomaterials reduces junction resistance of the desired areas under exposure to a high energy flash light source while the other areas not being masked by said physical mask will become electrically conductive; and
   (e) exposing said coated substrate to the high energy flash light source to anneal and pattern said coated substrate in order to form the conductive film with a pattern while said conductive film is cured under said high energy flash light source without post-treatment including thermal or chemical curing.

2. The method of claim 1, wherein said nanomaterial is a silver-based nanowire which is linear and has an aspect ratio of above 150.

3. The method of claim 1, wherein said nanomaterial is a silver-based nanowire which is linear and has a length of 10-15 μm and a diameter of about 70 nm.

4. The method of claim 1, wherein said substrate is polyethylene terephthalate.

5. The method of claim 1, wherein said cleaning comprises the following steps:
   (a) wiping the substrate with a detergent;
   (b) rinsing the substrate with deionized water;
   (c) rinsing the substrate with acetone;
   (d) drying the substrate at about 70° C. for about 5 minutes;
   (e) immersing the substrate in a boiling isopropyl alcohol for about 10 minutes;
   (f) rinsing the substrate with a fresh isopropyl alcohol; and
   (g) drying the substrate at about 70° C. for about 5 minutes.

6. The method of claim 1, wherein said nanomaterial-containing ink comprises a plurality of silver-based nanowires and a solvent of about 90% v/v isopropyl alcohol/ethanol.

7. The method of claim 6, wherein said plurality of silver-based nanowires is dissolved in said solvent in a concentration of 10 g/L.

8. The method of claim 1, wherein said coating is performed by an adhesive coating device having a Mayer rod.

9. The method of claim 8, wherein said Mayer rod is Mayer rod number 4.

10. The method of claim 8, wherein said coating further comprises adding said nanomaterial-containing ink alongside with movement of the Mayer rod at an addition rate of about 2-5 ml/min or the addition rate is in proportion to the size of the substrate with an aid of a syringe pump.

11. The method of claim 10, wherein the movement of the Mayer rod is controlled and maintained at a constant speed of about 120 cm per minute.

12. The method of claim 1, wherein said coating is performed at about 34° C.

13. The method of claim 1, wherein said coating further comprises drying the coated substrate at about 70° C. for about 5 minutes followed by cutting the coated substrate into smaller pieces prior to said masking by the physical mask to said coated substrate.

14. The method of claim 1, wherein said physical mask has a pattern which corresponds to said desired areas where a high energy light pulse generated from said high energy light source is masked by said physical mask when said physical mask is situated in horizontal position between said high energy light source and said coated substrate.

15. The method of claim 1, wherein said high energy flash light source is a xenon-based flash lamp capable of generating a light with a wavelength from 240 nm to 1,000 nm.

16. The method of claim 15, wherein said light has a wavelength from 370 nm to 1,000 nm.

17. The method of claim 1, wherein said coated substrate is exposed under said high energy flash light source for about 1-120 seconds with an average power density of about 10 W/cm$^2$ and a pulse rate of 2 pulses per second or a pulse duration of around 0.52 ms.

18. The method of claim 1, wherein said high energy flash light source generates a peak power density during each pulse which is about 1,000 times higher than said average power density.

* * * * *